(12) United States Patent
Tokuda et al.

(10) Patent No.: US 11,271,368 B2
(45) Date of Patent: Mar. 8, 2022

(54) SEMICONDUCTOR LASER AND ELECTRONIC APPARATUS

(71) Applicant: SONY SEMICONDUCTOR SOLUTIONS CORPORATION, Kanagawa (JP)

(72) Inventors: Kota Tokuda, Kanagawa (JP); Hideki Watanabe, Miyagi (JP); Takayuki Kawasumi, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 30 days.

(21) Appl. No.: 16/960,710

(22) PCT Filed: Jan. 17, 2019

(86) PCT No.: PCT/JP2019/001192
§ 371 (c)(1),
(2) Date: Jul. 8, 2020

(87) PCT Pub. No.: WO2019/146478
PCT Pub. Date: Aug. 1, 2019

(65) Prior Publication Data
US 2021/0066887 A1 Mar. 4, 2021

(30) Foreign Application Priority Data

Jan. 23, 2018 (JP) .............................. JP2018-008955

(51) Int. Cl.
*H01S 5/00* (2006.01)
*H01S 5/20* (2006.01)
(Continued)

(52) U.S. Cl.
CPC .......... *H01S 5/2031* (2013.01); *H01S 5/0421* (2013.01); *H01S 5/22* (2013.01);
(Continued)

(58) Field of Classification Search
CPC ........ H01S 5/22; H01S 5/0421; H01S 5/3214; H01S 5/2031; H01S 5/309; H01S 5/34333
See application file for complete search history.

(56) References Cited

U.S. PATENT DOCUMENTS

| 2004/0184497 A1* | 9/2004 | Kneissl | ................. B82Y 20/00 372/45.01 |
| 2005/0279994 A1* | 12/2005 | Ueda | ..................... B82Y 20/00 257/33 |

(Continued)

FOREIGN PATENT DOCUMENTS

| CN | 103477513 A | 12/2013 |
| CN | 104836118 A | 8/2015 |

(Continued)

OTHER PUBLICATIONS

International Search Report and Written Opinion of PCT Application No. PCT/JP2019/001192, dated Mar. 26, 2019, 09 pages of ISRWO.

*Primary Examiner* — Kinam Park
(74) *Attorney, Agent, or Firm* — Chip Law Group

(57) ABSTRACT

A semiconductor laser according to one embodiment of the present disclosure includes a semiconductor stack. The semiconductor stack includes, in the following order, a first cladding layer, an active layer, one or a plurality of low-concentration impurity layers, a contact layer, and a second cladding layer that includes a transparent conductive material. The semiconductor stack further has, in a portion including the contact layer, a ridge extending in a stacked in-plane direction. Each low-concentration impurity layer has an impurity concentration of $5.0 \times 10^{17}$ cm$^{-3}$ or less, and a total thickness of the low-concentration impurity layer is 250 nm or more and 1000 nm or less. A distance between the (Continued)

second cladding layer and the low-concentration impurity layer closest to the second cladding layer is 150 nm or less.

9 Claims, 10 Drawing Sheets

(51) Int. Cl.
    *H01S 5/042*     (2006.01)
    *H01S 5/22*     (2006.01)
    *H01S 5/32*     (2006.01)
    *H01S 5/30*     (2006.01)
    *H01S 5/40*     (2006.01)
    *H01S 5/343*     (2006.01)

(52) U.S. Cl.
    CPC ............ *H01S 5/309* (2013.01); *H01S 5/3214* (2013.01); *H01S 5/34333* (2013.01); *H01S 5/4043* (2013.01); *H01S 5/4093* (2013.01)

(56) References Cited

U.S. PATENT DOCUMENTS

| | | | | |
|---|---|---|---|---|
| 2010/0278207 | A1* | 11/2010 | Sonobe | H01S 5/222 372/46.012 |
| 2012/0213242 | A1* | 8/2012 | Tanaka | H01S 5/16 372/50.1 |
| 2014/0014998 | A1* | 1/2014 | Ohno | B82Y 20/00 257/99 |
| 2015/0111325 | A1* | 4/2015 | Hsu | H01S 5/0202 438/27 |
| 2015/0180203 | A1* | 6/2015 | Kinugawa | H01S 5/162 372/45.01 |
| 2017/0077677 | A1 | 3/2017 | Hsu et al. | |
| 2018/0131161 | A1* | 5/2018 | Kawaguchi | H01S 5/2009 |

FOREIGN PATENT DOCUMENTS

| | | |
|---|---|---|
| CN | 107851969 A | 3/2018 |
| JP | 2001-077463 A | 3/2001 |
| JP | 2004-289157 A | 10/2004 |
| JP | 2005-150568 A | 6/2005 |
| JP | 2006-041491 A | 2/2006 |
| JP | 2007-129246 A | 5/2007 |
| JP | 2009-094360 A | 4/2009 |
| JP | 2009-117695 A | 5/2009 |
| JP | 2013-042107 A | 2/2013 |
| JP | 2016-066670 A | 4/2016 |
| WO | 2013/157176 A1 | 10/2013 |
| WO | 2017/017928 A1 | 2/2017 |

\* cited by examiner

[FIG. 1]
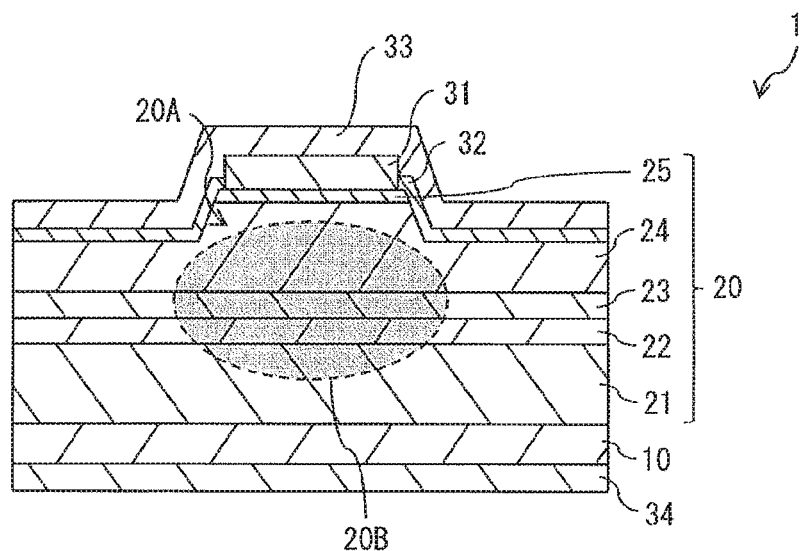
[FIG. 2]
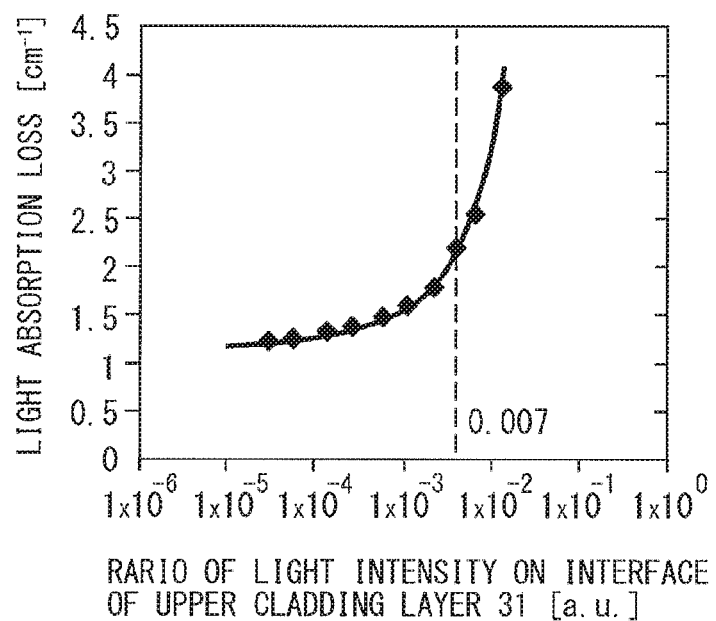

[FIG. 3]
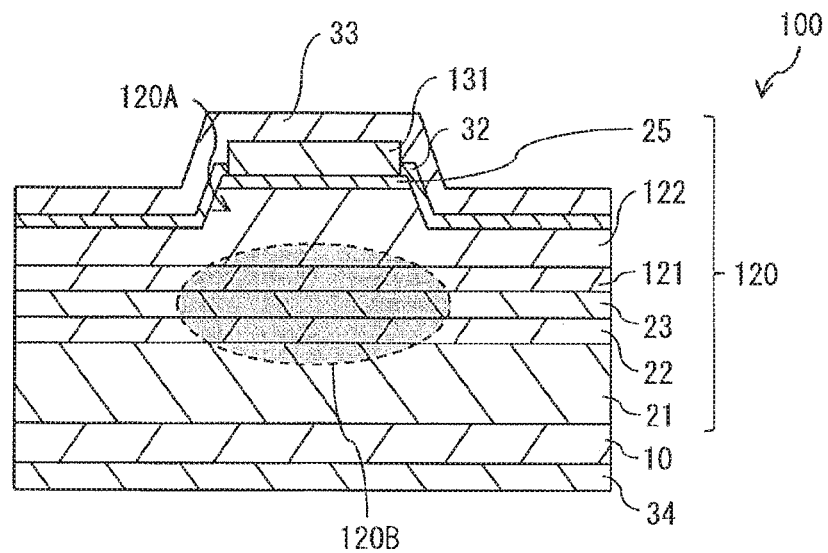
[FIG. 4]
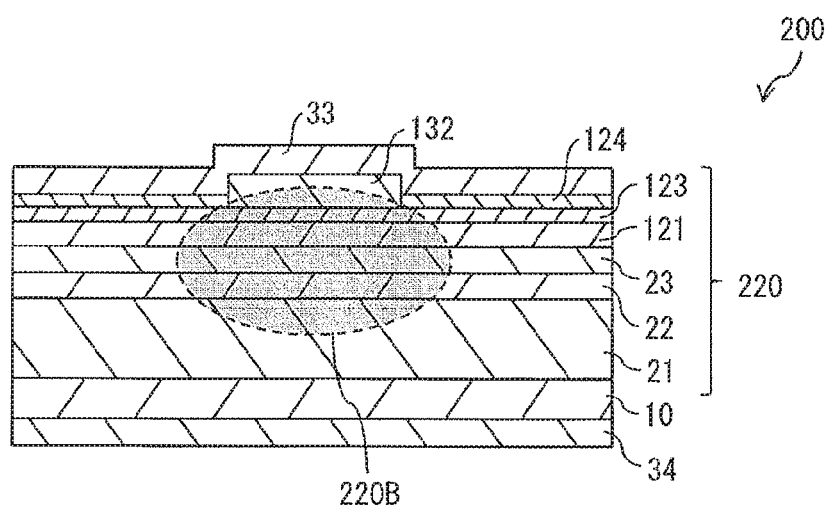

[FIG. 5]
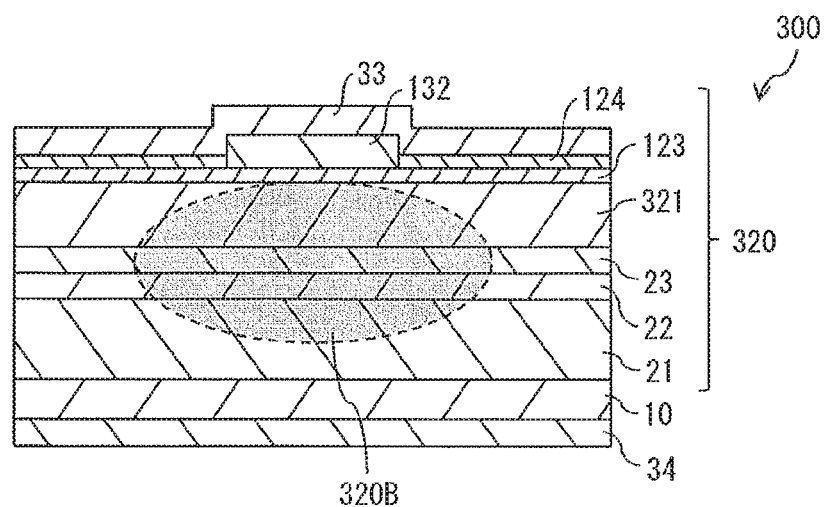
[FIG. 6]
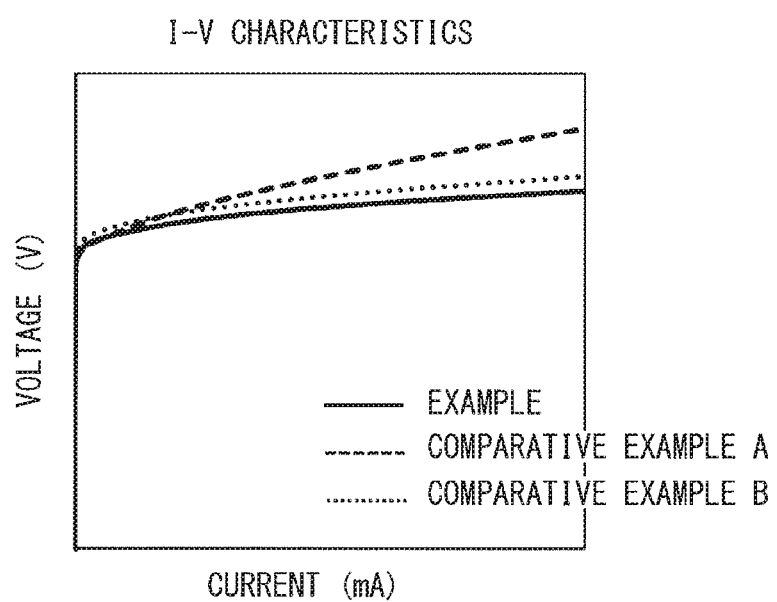

[FIG. 7]
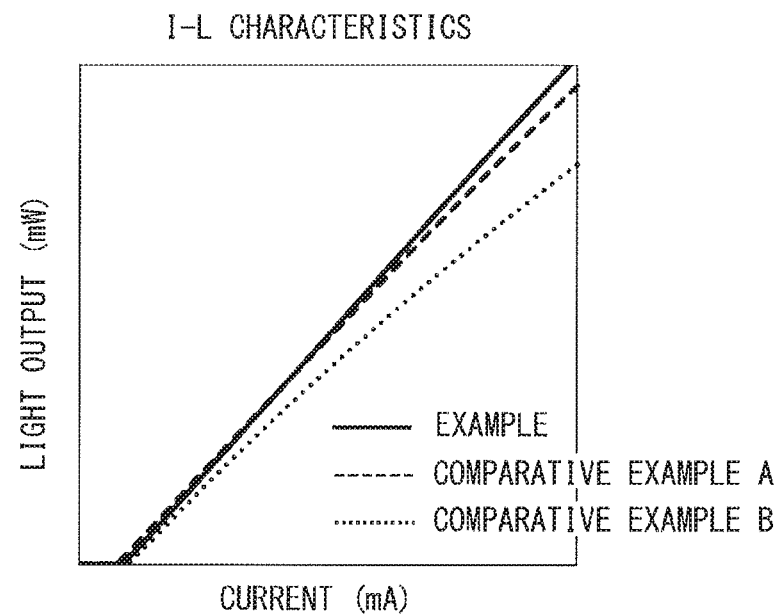
[FIG. 8]
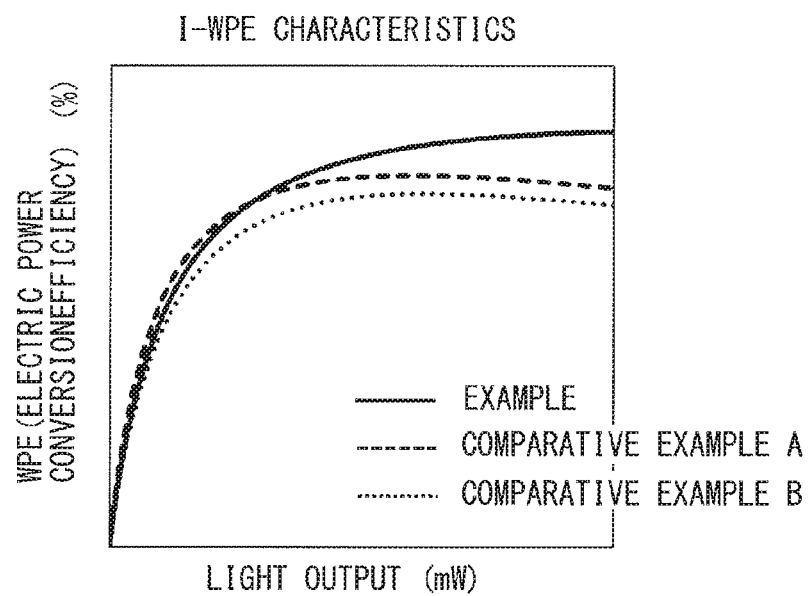

[ FIG. 9 ]
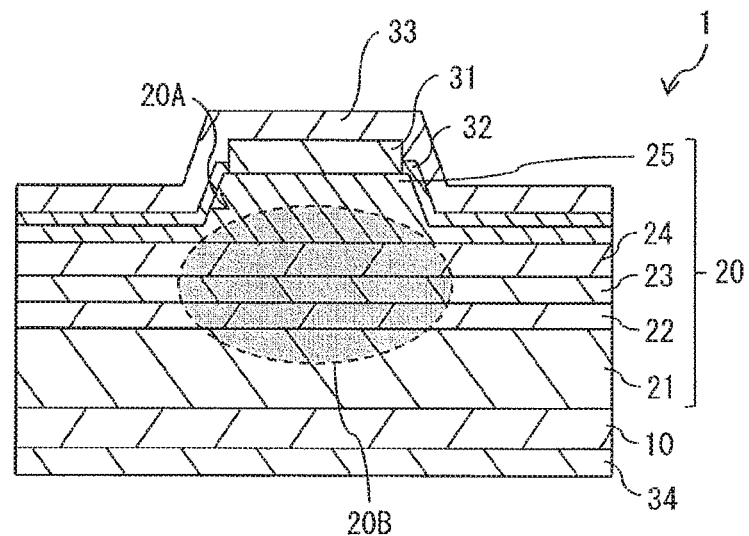
[ FIG. 10 ]
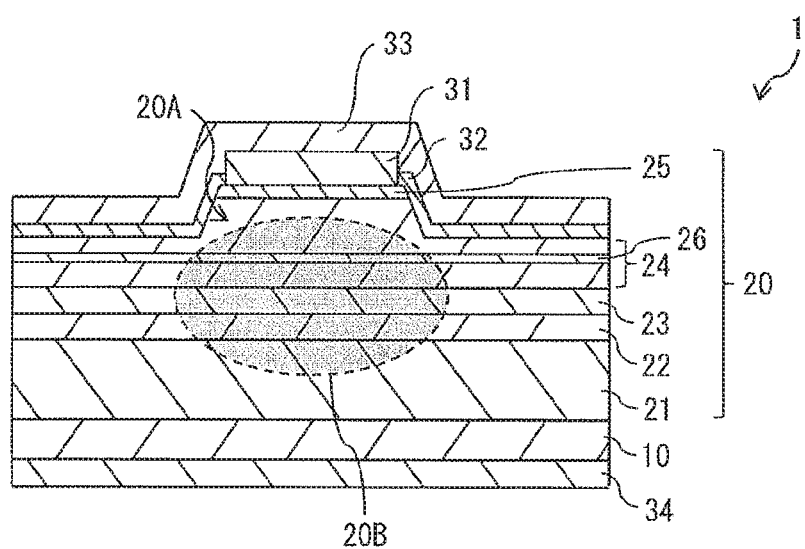

[ FIG. 11 ]
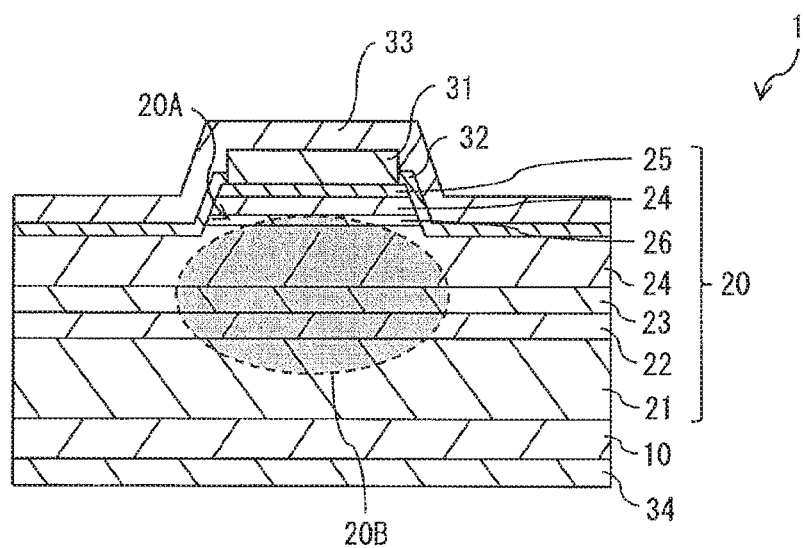
[ FIG. 12 ]
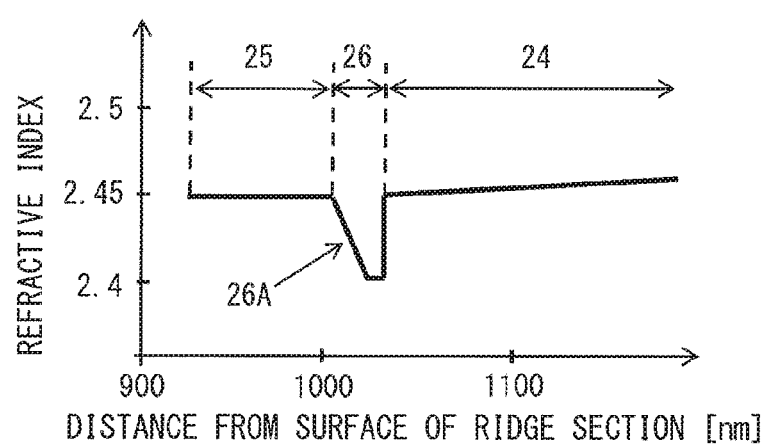

[ FIG. 13 ]
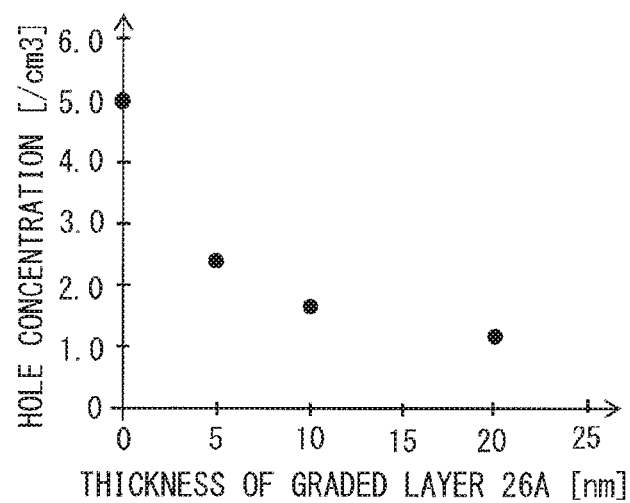
[ FIG. 14 ]
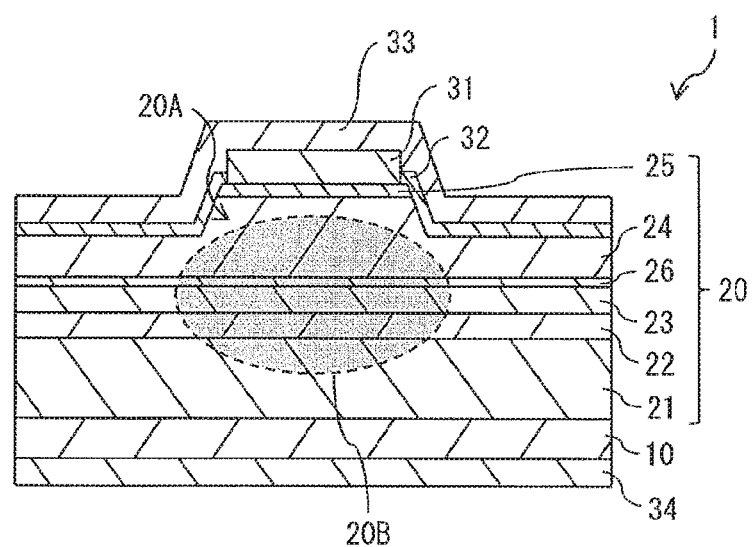

[FIG. 15]
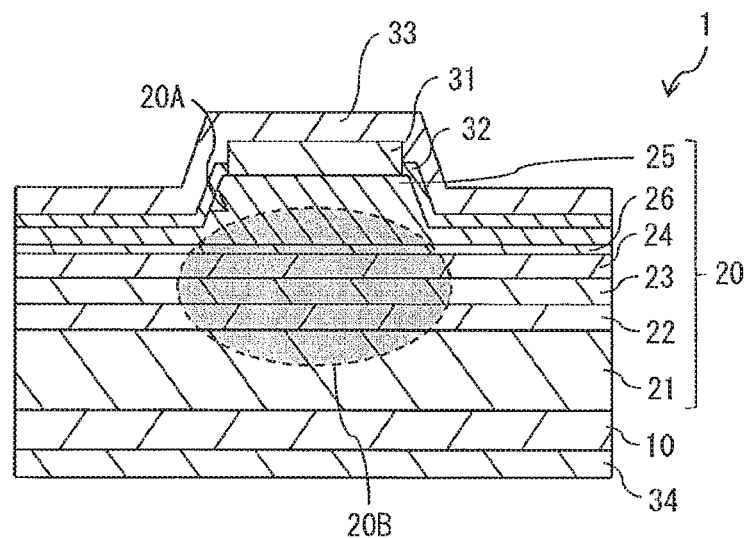
[FIG. 16]
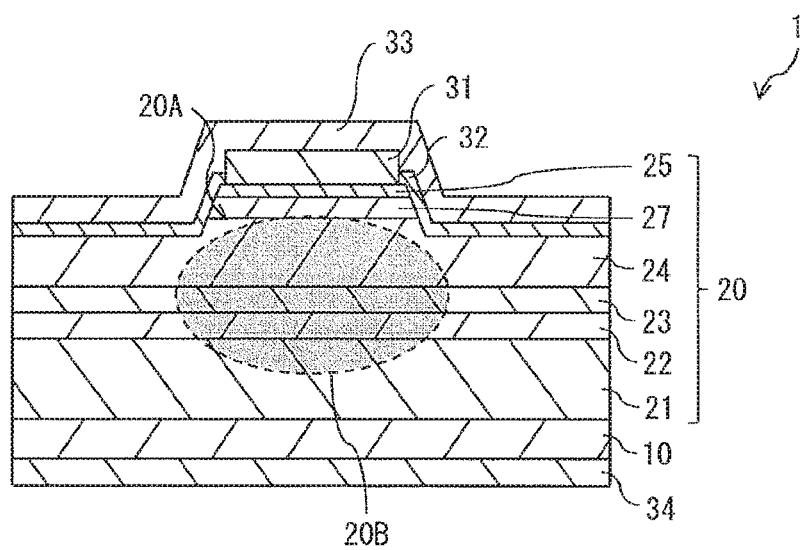

[ FIG. 17 ]
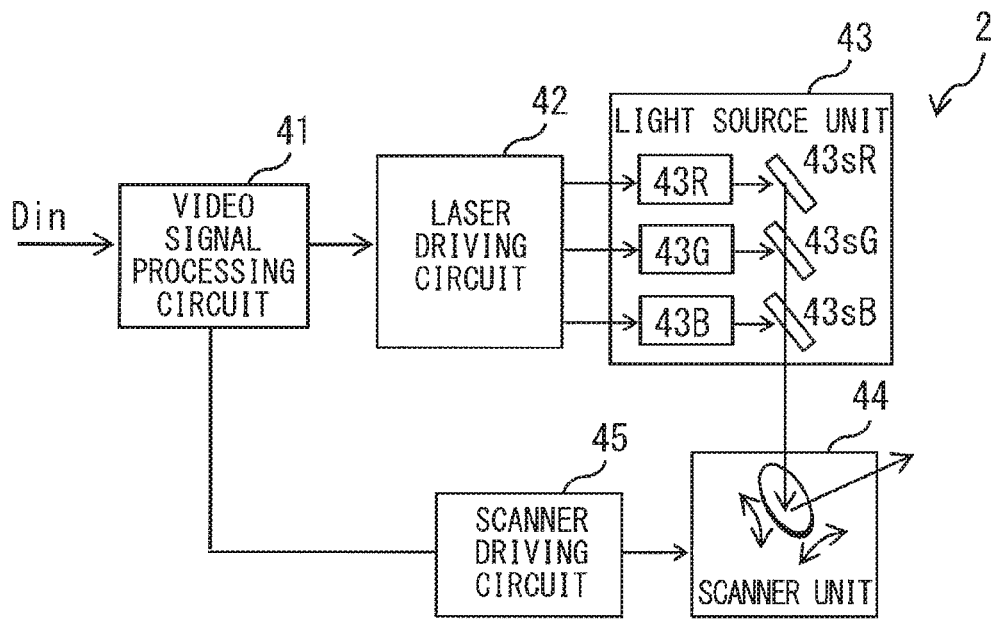
[ FIG. 18 ]
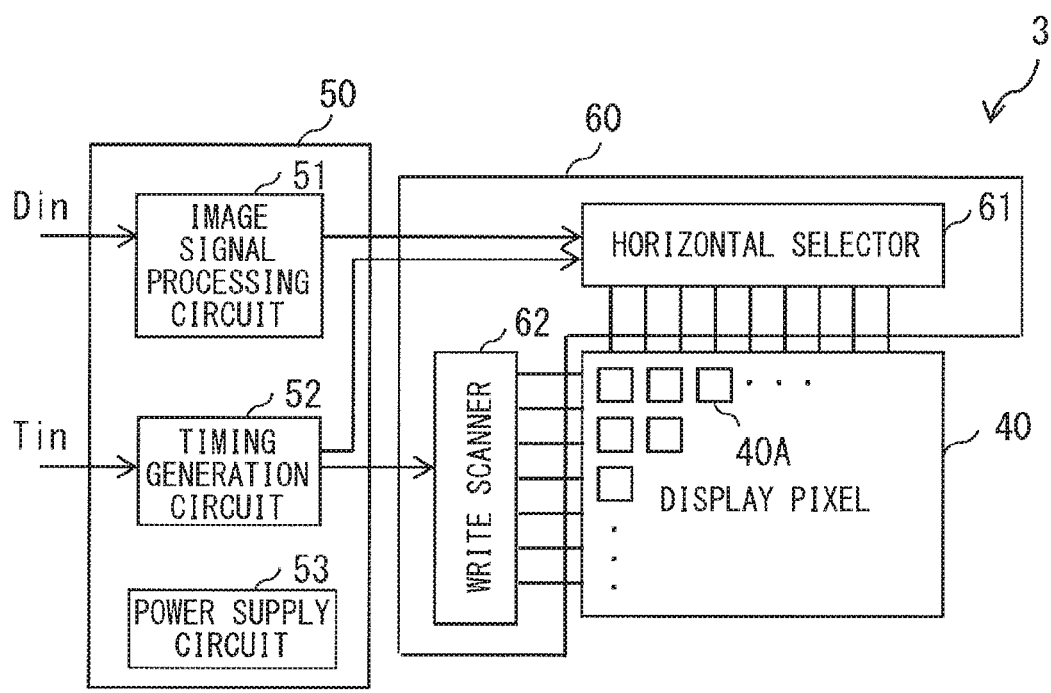

[ FIG. 19 ]
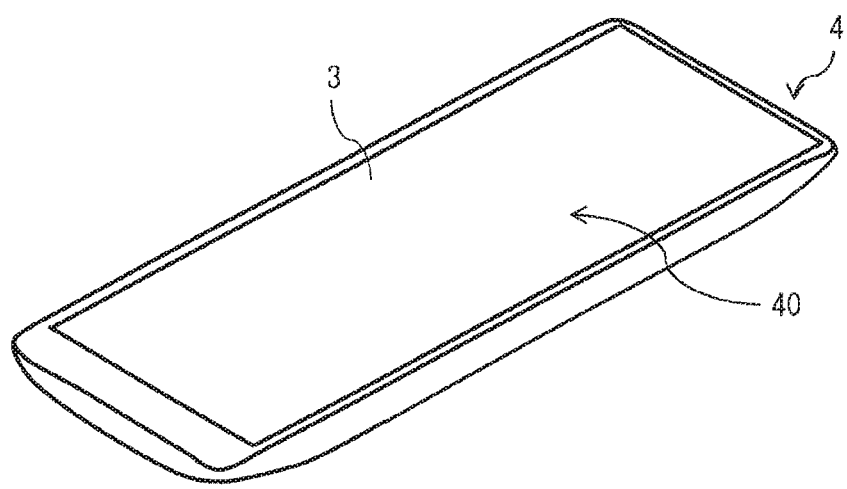

SEMICONDUCTOR LASER AND ELECTRONIC APPARATUS

CROSS REFERENCE TO RELATED APPLICATIONS

This application is a U.S. National Phase of International Patent Application No. PCT/JP2019/001192 filed on Jan. 17, 2019, which claims priority benefit of Japanese Patent Application No. JP 2018-008955 filed in the Japan Patent Office on Jan. 23, 2018. Each of the above-referenced applications is hereby incorporated herein by reference in its entirety.

TECHNICAL FIELD

The present disclosure relates to a semiconductor laser and an electronic apparatus including the same.

BACKGROUND ART

Various technologies of semiconductor lasers have been disclosed.

CITATION LIST

Patent Literature

PTL 1: Japanese Unexamined Patent Application Publication No. 2009-94360
PTL 2: Japanese Unexamined Patent Application Publication No. 2013-42107
PTL 3: Japanese Unexamined Patent Application Publication No. 2004-289157
PTL 4: Japanese Unexamined Patent Application Publication No. 2007-129246
PTL 5: Japanese Unexamined Patent Application Publication No. 2016-66670
PTL 6: Japanese Unexamined Patent Application Publication No. 2001-77463
PTL 7: Japanese Unexamined Patent Application Publication No. 2009-117695
PTL 8: Japanese Unexamined Patent Application Publication No. 2006-41491

SUMMARY OF THE INVENTION

High power output of semiconductor lasers have been demanded to increase luminance. Such high power output poses an issue of heat generation. The amount of heat generation is determined on the basis of electric power conversion efficiency. Thus, in order to reduce such an amount of heat generation, not only light output characteristics but also reduction of a drive voltage are important. Therefore, it is desirable to provide a semiconductor laser that makes it possible to reduce a drive voltage and an electronic apparatus including the same.

A first semiconductor laser according to one embodiment of the present disclosure includes a semiconductor stack. The semiconductor stack includes, in the following order, a first cladding layer, an active layer, one or a plurality of low-concentration impurity layers, a contact layer, and a second cladding layer that includes a transparent conductive material. The semiconductor stack further has, in a portion including the contact layer, a ridge extending in a stacked in-plane direction. Each low-concentration impurity layer has an impurity concentration of $5.0 \times 10^{17}$ $cm^{-3}$ or less, and a total thickness of the low-concentration impurity layer is 250 nm or more and 1000 nm or less. A distance between the second cladding layer and the low-concentration impurity layer closest to the second cladding layer is 150 nm or less.

A second semiconductor laser according to one embodiment of the present disclosure includes a semiconductor stack. The semiconductor stack includes, in the following order, a first cladding layer, an active layer, one or more low-concentration impurity layers that has an impurity concentration of $5.0 \times 10^{17}$ $cm^{-3}$ or less, a contact layer, and a second cladding layer that includes a transparent conductive material. The semiconductor stack further has, in a portion including the contact layer, a ridge extending in a stacked in-plane direction. The second cladding layer is located away from a light waveguide region that is to be generated inside the semiconductor stack in a case where the semiconductor laser is driven.

A first electronic apparatus according to one embodiment of the present disclosure includes the first semiconductor laser as a light source.

A second electronic apparatus according to one embodiment of the present disclosure includes the second semiconductor laser as a light source.

In the first semiconductor laser and the first electronic apparatus according to one embodiment of the present disclosure, the second cladding layer includes the transparent conductive material. Further, the one or the plurality of low-concentration impurity layers provided between the active layer and the contact layer has the impurity concentration of $5.0 \times 10^{17}$ $cm^{-3}$ or less, and the total thickness of the low-concentration impurity layer is 250 nm or more and 1000 nm or less. In addition, the distance between the second cladding layer and the low-concentration impurity layer closest to the second cladding layer is 150 nm or less. This allows for reduction of the light absorption by the transparent conductive material, and further, even without, e.g., a thick cladding layer including AlGaN doped with Mg, light is confined in a stacking direction by the second cladding layer including the transparent conductive material. The first semiconductor laser and the first electronic apparatus according to one embodiment of the present disclosure further include a strip-shaped ridge. Therefore, the light is also confined in a transverse direction.

In the second semiconductor laser and the second electronic apparatus according to one embodiment of the present disclosure, the second cladding layer includes the transparent conductive material. Further, the one or the plurality of low-concentration impurity layers provided between the active layer and the contact layer has the impurity concentration of $5.0 \times 10^{17}$ $cm^{-3}$ or less. In addition, the second cladding layer is located away from a light waveguide region that is to be generated inside the semiconductor stack in a case where the semiconductor laser is driven. This allows for reduction of the light absorption by the transparent conductive material, and further, even without, e.g., a thick cladding layer including AlGaN doped with Mg, light is confined in a stacking direction by the second cladding layer including the transparent conductive material. The first semiconductor laser and the first electronic apparatus according to one embodiment of the present disclosure further include a strip-shaped ridge. Therefore, the light is also confined in a transverse direction.

BRIEF DESCRIPTION OF DRAWING

FIG. 1 is a diagram illustrating an example of a cross-sectional configuration of a semiconductor laser according to one embodiment of the present disclosure.

FIG. 2 is a diagram illustrating one example of a relationship between a light intensity on an interface of an upper cladding layer and a light absorption loss.

FIG. 3 is a diagram illustrating one example of a cross-sectional configuration of a semiconductor laser according to Comparative Example A.

FIG. 4 is a diagram illustrating one example of a cross-sectional configuration of a semiconductor laser according to Comparative Example B.

FIG. 5 is a diagram illustrating one example of a cross-sectional configuration of a semiconductor laser according to Comparative Example C.

FIG. 6 is a diagram illustrating one example of I-V characteristics of Example and of Comparative Examples A and B.

FIG. 7 is a diagram illustrating one example of I-L characteristics of Example and of Comparative Examples A and B.

FIG. 8 is a diagram illustrating one example of I-WPE characteristics of Example and of Comparative Examples A and B.

FIG. 9 is a diagram illustrating one modification example of the cross-sectional configuration of the semiconductor laser of FIG. 1.

FIG. 10 is a diagram illustrating one modification example of the cross-sectional configuration of the semiconductor laser of FIG. 1.

FIG. 11 is a diagram illustrating one modification example of the cross-sectional configuration of the semiconductor laser of FIG. 1.

FIG. 12 is a diagram illustrating one example of refractive index distribution in a case where a carrier blocking layer is provided with a composition gradient.

FIG. 13 is a diagram illustrating one example of a relationship between a thickness of a graded layer of FIG. 12 and a hole concentration on an interface.

FIG. 14 is a diagram illustrating one modification example of a cross-sectional configuration of the semiconductor laser of FIG. 1.

FIG. 15 is a diagram illustrating one modification example of a cross-sectional configuration of the semiconductor laser of FIG. 1.

FIG. 16 is a diagram illustrating one modification example of a cross-sectional configuration of the semiconductor laser of FIG. 1.

FIG. 17 is a diagram illustrating one example of a schematic configuration of a projector to which the semiconductor laser is applied.

FIG. 18 is a diagram illustrating one example of a schematic configuration of a display device to which the semiconductor laser is applied.

FIG. 19 is a diagram illustrating one example of a perspective configuration of an electronic apparatus to which the semiconductor laser is applied.

MODES FOR CARRYING OUT THE INVENTION

Hereinafter, embodiments of the present disclosure will be described in detail with reference to the drawings. The following description is one specific example of the present disclosure, and the present disclosure should not be limited to the following embodiments. Moreover, the present disclosure is not limited to positions, dimensions, dimension ratios, and other factors of respective elements illustrated in the drawings. It should be noted that the description is given in the following order.

1. First Embodiment (Semiconductor Laser)
2. Modification Examples (Semiconductor Laser)
3. Second Embodiment (Projector)
4. Third Embodiment (Display Device)
5. Fourth Embodiment (Electronic Apparatus)

1. FIRST EMBODIMENT

[Configuration]

Description is given of a configuration of a semiconductor laser 1 according to a first embodiment of the present disclosure. FIG. 1 illustrates an example of a cross-sectional configuration of the semiconductor laser 1 according to the present embodiment. The semiconductor laser 1 has a configuration in which a semiconductor stack 20, which will be described later, is sandwiched between a pair of resonator end surfaces in a resonator direction (a direction in which a ridge section 20A extends). Accordingly, the semiconductor laser 1 is one kind of so-called edge-emitting type semiconductor laser.

The semiconductor laser 1 includes the semiconductor stack 20 on a substrate 10. The semiconductor stack 20 includes, for example, a lower cladding layer 21, a lower guiding layer 22, an active layer 23, a low-concentration impurity layer 24, and a contact layer 25 in this order from side of the substrate 10. The lower cladding layer 21 corresponds to one example of "a first cladding layer" of the present disclosure. It is to be noted that the semiconductor stack 20 may further include any layer (for example, a buffer layer) other than the layers mentioned above. Moreover, in the semiconductor stack 20, the lower guiding layer 22 may be omitted.

The substrate 10 and the semiconductor stack 20 include, for example, a Group III-V nitride semiconductor such as GaN. Herein, the "Group III-V nitride semiconductor" refers to a semiconductor including at least one selected from a group of Group 3B elements in the short form of the periodic table (at least one element of Ga, Al, In, or B) and at least an N element of Group 5B elements in the short form of the periodic table. An example of the Group III-V nitride semiconductor includes a gallium nitride-based compound including Ga and N. Examples of the gallium nitride-based compound include GaN, AlGaN, and AlGaInN. The Group III-V nitride semiconductor is doped with an n-type impurity of a Group IV or VI element such as Si, Ge, O, or Se or a p-type impurity of a Group II or IV element such as Mg, Zn, or C on an as-needed basis. The substrate 10 may include AlN, $Al_2O_3$ (sapphire), SiC, Si, or ZrO.

The substrate 10 may be a Group III-V nitride semiconductor substrate such as a GaN substrate. In this case, a crystal face of a main surface of the GaN substrate may be one of a polar face, a semi-polar face, and a non-polar face. The polar face is represented by, for example, {0,0,0,1} or {0,0,0,-1} with use of face indices. The semi-polar face is represented by, for example, {2,0,-2,1}, {1,0,-1,1}, {2,0,-2,-1}, or {1,0,-1,-1} with use of face indices. The non-polar face is represented by, for example, {1,1,-2,0} or {1,-1,0,0} with use of face indices.

The lower cladding layer 21 is formed over a main surface of the substrate 10, and includes, for example, a semiconductor layer having n-type conductivity (an n-type semiconductor layer). The lower cladding layer 21 includes, for example, one of a GaN layer, an AlGaN layer, and an AlGaInN layer, or at least two layers of these layers. In the lower cladding layer 21, for example, Si is used as a dopant to obtain n-type conductivity. The lower cladding layer 21 has a thickness of, e.g., 500 nm to 3000 nm.

The lower guiding layer 22 is formed, for example, over the lower cladding layer 21, and includes, for example, an n-type semiconductor layer. The lower guiding layer 22 includes, for example, one of a GaN layer, an AlGaN layer, an InGaN layer, and an AlGaInN layer, or at least two layers of these layers. In the lower guiding layer 22, for example, Si is used as a dopant to obtain n-type conductivity. The lower guiding layer 22 has a thickness of, e.g., 10 nm or more and 500 nm or less. It is to be noted that the lower guiding layer 22 may include a non-doped semiconductor layer.

The active layer 23 is formed, for example, over the lower guiding layer 22. The active layer 23 is provided between the lower guiding layer 22 and the low-concentration impurity layer 24. The active layer 23 is configured, for example, by alternately stacking barrier layers and well layers, and has a multiple well structure. It is to be noted that the active layer 23 may have a multiple quantum well structure.

Each of the well layers includes Ga and a Group III-V nitride semiconductor. Each of the well layers includes, for example, an n-type semiconductor layer. In each of the well layers, for example, Si is used as a dopant to obtain n-type conductivity. Each of the well layers has a thickness of, e.g., 1 nm to 100 nm. It is to be noted that each of the well layers may include a non-doped semiconductor layer. A wavelength of a photon generated by each of the well layers is, for example, from 430 nm to 550 nm.

Each of the barrier layers includes a Group III-V nitride semiconductor. Each of the barrier layers includes, for example, an n-type semiconductor layer. In each of the barrier layers, for example, Si is used as a dopant to obtain n-type conductivity. Each of the barrier layers has a thickness of, e.g., 1 nm to 100 nm. It is to be noted that each of the barrier layers may include a non-doped semiconductor layer. A band gap of the barrier layer has a value equal to or larger than a band gap that becomes maximum in each of the well layers.

The low-concentration impurity layer 24 is formed, for example, over the active layer 23, and includes, for example, an n-type semiconductor layer. The low-concentration impurity layer 24 includes, for example, one of a GaN layer, an AlGaN layer, an InGaN layer, and an AlGaInN layer, or at least two layers of these layers. The low-concentration impurity layer 24 includes an impurity. Herein, the impurity refers to an element other than the elements (specifically, an N element and at least one element of Ga, Al, In, or B) included in the Group III-V nitride semiconductor. The impurity includes, for example, at least one of Mg, C, Si, or O. The concentration of the impurity included in the low-concentration impurity layer 24 is $5.0 \times 10^{17}$ cm$^{-3}$ or less, e.g., $5.0 \times 10^{16}$ cm$^{-3}$. A thickness of the low-concentration impurity layer 24 at a portion that faces the ridge section 20A is 250 nm or more and 1000 nm or less, and is preferably 500 nm or more and 1000 nm or less. It is to be noted that, in the present embodiment, the low-concentration impurity layer 24 is provided not only to the bottom of the ridge section 20A but also to a base portion of the ridge section 20A. Therefore, a portion, which will be described later, located directly under the ridge section 20A has a larger thickness than the base portion of the ridge section 20A.

The concentration of the impurity included in the low-concentration impurity layer 24 is $5.0 \times 10^{17}$ cm$^{-3}$ or less, thus making it possible to reduce or avoid deterioration of light output characteristics due to light absorption caused by the impurity. In addition, the thickness of the low-concentration impurity layer 24 at the portion that faces the ridge section 20A is 250 nm or more, thus making it possible to reduce or avoid deterioration of light output characteristics due to light absorption by the contact layer 25 and the upper cladding layer 31. In addition, the thickness of the low-concentration impurity layer 24 at the portion that faces the ridge section 20A is 1000 nm or less, thus making it possible to reduce or avoid deterioration of electrical characteristics due to an increase in the resistive component of the semiconductor layer.

It is unnecessary for the low-concentration impurity layer 24 to have a uniform impurity concentration and a uniform composition ratio of constituent materials. The low-concentration impurity layer 24 may include multiple layers having different impurity concentrations and different composition ratios of constituent materials. In this case, its total thickness is 250 nm or more and 1000 nm or less, and is preferably 500 nm or more and 1000 nm or less. A layer (for example, a carrier blocking layer or a cladding layer) may be provided in the low-concentration impurity layer 24, the layer being different from the low-concentration impurity layer 24 and having a smaller thickness than the low-concentration impurity layer 24.

The contact layer 25 is formed, for example, over the low-concentration impurity layer 24, and includes, for example, a semiconductor layer having p-type conductivity (a p-type semiconductor layer). The contact layer 25 includes, for example, one of a GaN layer, an AlGaN layer, and an AlGaInN layer, or at least two layers of these layers. In the contact layer 25, for example, Mg is used as a dopant to obtain p-type conductivity. The contact layer 25 has a thickness of, e.g., 1 nm or more and 150 nm or less. In this case, a distance between the low-concentration impurity layer 24 and the upper cladding layer 31 is equal to the thickness of the contact layer 25, and is, for example, 1 nm or more and 150 nm or less.

An upper portion of the semiconductor stack 20, specifically, a portion of the low-concentration impurity layer 24 and the contact layer 25 form the ridge section 20A having a convex shape. The contact layer 25 is formed over the upper surface of the ridge section 20A. The ridge section 20A is ridge-shaped at a portion including the contact layer 25, the ridge extending in one stacked in-plane direction (a resonator direction) of the semiconductor stack 20. The ridge section 20A is sandwiched between a pair of resonator end surfaces in the semiconductor stack 20. The ridge section 20A has a length of, e.g., 50 µm to 3000 µm. The ridge section 20A has a width (a length in a direction orthogonal to the resonator) of, e.g., 0.5 µm to 100 µm. The ridge section 20A is formed, for example, by removal of a portion from a surface of the contact layer 25 to a middle of the low-concentration impurity layer 24 by etching.

A side surface and the base portion of the ridge section 20A of a top surface of the semiconductor stack 20 are covered with an insulating layer 32. The insulating layer 32 includes, for example, SiO$_2$. The insulating layer 32 has a thickness of, e.g., 10 nm to 500 nm.

The semiconductor laser 1 further includes an upper cladding layer 31, an insulating layer 32, and an upper electrode layer 33 which are located over the semiconductor stack 20, and a lower electrode layer 34 which is located on the back surface of the semiconductor stack 20. The upper cladding layer 31 corresponds to one example of "a second cladding layer" of the present disclosure.

The upper cladding layer 31 is formed over the semiconductor stack 20 in contact with the upper surface of the ridge section 20A. The upper cladding layer 31 is formed over the upper surface of the contact layer 25. The upper cladding layer 31 includes a transparent conductive material. Examples of the transparent conductive material contained in the upper cladding layer 31 include ITO (Indium Tin Oxide) and ITiO (Indium Titanium Oxide). The upper cladding layer 31 has a thickness of, e.g., 10 nm or more and 500 nm or less. The upper cladding layer 31 may be electrically coupled to the contact layer 25, and the layer configuration of the upper cladding layer 31 is not limited to the above configuration. Moreover, the upper cladding layer 31 may be in contact with the whole, or only a portion, of the upper surface of the contact layer 25.

The upper electrode layer 33 is formed over the upper cladding layer 31. The upper electrode layer 33 has a configuration in which, for example, a Ti layer, a Pt layer, an Au layer are stacked in this order from side closer to the upper cladding layer 31. The Ti layer has a thickness of, e.g., 2 nm to 100 nm. The Pt layer has a thickness of, e.g., 10 nm to 300 nm. The Au layer has a thickness of, e.g., 10 nm to 300 nm. The upper electrode layer 33 may be electrically coupled to the upper cladding layer 31, and the layer configuration or the upper electrode layer 33 is not limited to the above configuration. Moreover, the upper electrode layer 33 may be in contact with the whole, or only a portion, of the upper surface of the upper cladding layer 31.

The lower electrode layer 34 is formed, for example, in contact with the back surface of the substrate 10. The lower electrode layer 34 has a configuration in which, for example, a Ti layer and an Al layer are stacked in this order from side closer to the substrate 10. The Ti layer has a thickness of, e.g., 5 nm to 50 nm. The Al layer has a thickness of, e.g., 10 nm to 300 nm. The lower electrode layer 34 may be electrically coupled to the substrate 10, and the layer configuration of the lower electrode layer 34 is not limited to the above configuration. Moreover, the lower electrode layer 34 may be in contact with the whole, or only a portion, of the back surface of the substrate 10.

[Manufacturing Method]

Next, description is given of a method of manufacturing the semiconductor laser 1 according to the present embodiment.

First, for example, the substrate 10 including GaN is prepared. Next, the lower cladding layer 21 and the lower guiding layer 22 are epitaxially grown at, for example, a growth temperature of 1050° C. on a front surface of the substrate 10 using, for example, an MOCVD (Metal Organic Chemical Vapor Deposition) method. Next, the active layer 23 is epitaxially grown at, for example, a growth temperature of 700° C. using the MOCVD method. Next, the low-concentration impurity layer 24 and the contact layer 25 are epitaxially grown at, for example, a growth temperature of 1050° C. using the MOCVD method.

It is to be noted that, during execution of MOCVD, for example, trimethyl gallium ($(CH_3)_3Ga$) is used as a source gas of gallium, for example, trimethyl aluminum ($(CH_3)_3Al$) is used as a source gas of aluminum, and, for example, trimethyl indium ($(CH_3)_3In$) is used as a source gas of indium. Moreover, ammonia ($NH_3$) is used as a source gas of nitrogen. Further, for example, monosilane ($SiH_4$) is used as a source gas of silicon, and, for example, bis(cyclopentadienyl)magnesium ($(C_5H_5)_2Mg$) is used as a source gas of magnesium.

Next, a resist coating film having an opening in a region where the upper cladding layer 31 is to be formed is formed over the semiconductor stack 20, and the upper cladding layer 31 is formed using, for example, a vacuum deposition method or a sputtering method. Subsequently, at least a portion of the upper cladding layer 31, a portion of the contact layer 25, and a portion of the low-concentration impurity layer 24 are removed by etching using, for example, an RIE method. Thus, the ridge section 20A is formed, and the upper cladding layer 31 is formed over the ridge section 20A.

Next, the insulating layer 32 is formed, using, for example, a vacuum deposition method or a sputtering method, over the surface of the semiconductor stack 20 exposed by the etching. The upper electrode layer 33 is formed over the surfaces of the upper cladding layer 31 and the insulating layer 32 using, for example, a lift-off method. Subsequently, the lower electrode layer 34 is formed on the back surface of the substrate 10 using, for example, a lift-off method. Next, the substrate 10 is cut into a bar shape, and a coating film for control of reflectivity is formed over an exposed end surface portion. Moreover, the substrate 10 cut into the bar shape is further cut into a chip shape. Thus, the semiconductor laser 1 is manufactured.

[Operation]

In the semiconductor laser 1 having such a configuration, application of a predetermined voltage between the upper electrode layer 33 and the lower electrode layer 34 allows for injection of a current into the active layer 23 through the ridge section 20A. This causes light emission owing to recombination of electrons with holes. The light is reflected by a pair of resonator end surfaces, and is confined by the lower cladding layer 21 and the upper cladding layer 31, thus causing laser oscillation at a predetermined oscillation wavelength. At that time, a light waveguide region 20B through which the oscillating light is wave-guided is formed in the semiconductor stack 20. The laser light at the predetermined oscillation wavelength is then outputted from one of the resonator end surfaces to outside. The light waveguide region 20B is formed directly under the ridge section 20A with the active layer 23 as a center. The boundary of the light waveguide region 20B (a portion indicated by a broken line in FIG. 1) is a region having a light intensity, a ratio of which to the maximum light intensity in the light waveguide region 20B is 0.007.

The boundary of the light waveguide region 20B is determined using the above definition because a ratio of the light intensity on an interface of the upper cladding layer 31 and a light absorption loss have a relationship as illustrated in FIG. 2. FIG. 2 shows that, if the ratio of the light intensity on the interface of the upper cladding layer 31 becomes more than 0.007, the light absorption loss rapidly increases, thus resulting in deterioration of laser characteristics. That is to say, in a case where the upper cladding layer 31 is located in contact with the light waveguide region 20B, the light absorption is significantly large, thus resulting in deterioration of laser characteristics. In contrast, in a case where the upper cladding layer 31 is located away from the light waveguide region 20B, the light absorption loss is small, thus reducing deterioration of laser characteristics.

[Effects]

Next, description is given of effects in the semiconductor laser 1 in comparison with comparative examples.

In order to improve electric power conversion efficiency of the semiconductor laser, it is necessary to reduce a drive current value and a drive voltage value. In particular, for a nitride-based semiconductor laser, the challenge is how to reduce the drive voltage value. FIG. 3 illustrates an example of a cross-sectional configuration of a common nitride-based semiconductor laser 100 (a semiconductor laser 100 according to Comparative Example A). The semiconductor laser 100 typically includes an AlGaN layer as a cladding layer to obtain a refractive index step necessary for light confinement in a stacking direction. It should be noted that the semiconductor laser 100 is provided with a semiconductor stack 120 on the substrate 10, and is further provided with an upper guiding layer 121 and an upper cladding layer 122 instead of the low-concentration impurity layer 24. In addition, the semiconductor laser 100 is provided with, instead of the upper cladding layer 31, an upper electrode layer 131 including ITO over a ridge section 120A.

An AlGaN cladding layer is demanded to have a less refractive index and to perform carrier transport. Thus, an AlGaN cladding layer (the lower cladding layer 21) having n-type conductivity is formed at one side of the active layer 23 and an AlGaN cladding layer (the upper cladding layer 122) having p-type conductivity is formed at the other side of the active layer 23. At that time, in many cases, the upper cladding layer 122 is doped with Mg as an acceptor to obtain p-type conductivity. However, Mg in AlGaN has large activation energy for ionization, and it is difficult to generate a high concentration of hole carriers. This increases the resistance of the upper cladding layer 122 to increase the drive voltage of the semiconductor laser 100, thus resulting in deterioration of electric power conversion efficiency of the semiconductor laser 100.

FIG. 4 schematically illustrates a cross-sectional configuration of a semiconductor laser 200 according to Comparative Example B. The semiconductor laser 200 is provided with no upper cladding layer 122 and no ridge section 120A, and the contact layer 123 is in contact with the upper guiding layer 121. Moreover, the semiconductor laser 200 is provided with, instead of the upper electrode layer 131, an upper cladding layer 132 including ITO. In addition, an insulating layer 124 is provided around the upper cladding layer 132.

The refractive index of ITO for a wavelength of, e.g., 450 nm is around 2.0, which is sufficiently small compared to 2.5 that is the refractive index of the upper guiding layer 121. Therefore, the upper cladding layer 132 serves as a cladding layer that obtains a refractive index step for confining light in the stacking direction. The semiconductor laser 200 does not have to use a high-resistive AlGaN cladding layer having p-type conductivity, thus obtaining an advantage of reducing a drive voltage.

Furthermore, in the semiconductor laser 100, the ridge section 120A is formed, and the insulating layer 32 is formed around the ridge section 120A. The insulating layer 32 includes, e.g., $SiO_2$, and has a refractive index for a wavelength of, e.g., 450 nm of 1.46, which is sufficiently small compared to that of a nitride semiconductor. This makes it possible to obtain a refractive index step necessary for achieving light confinement in the width direction of the ridge section 120A.

In contrast, in the semiconductor laser 200, the upper cladding layer 132 is formed over the contact layer 123, and the insulating layer 124 is formed in a region where no upper cladding layer 132 is formed. The refractive index of the insulating layer 124 for a wavelength of, e.g., 450 nm is 1.46, which is sufficiently large compared to 2.0 that is the refractive index of the upper cladding layer 132 for the same wavelength. Therefore, even if no ridge section is formed, it is possible to achieve light confinement in a stacked in-plane direction, thus enabling stable laser operation, cost reduction, and better yield.

Now, the upper cladding layer 132 have a finite light absorption with respect to light with a wavelength of, e.g., 430 nm to 550 nm. Therefore, in the semiconductor laser 200, in a transverse optical mode formed in the resonator, the intensity of light leaked into the upper cladding layer 132 is large (see a light waveguide region 220B in FIG. 4). As a result, receiving loss caused by the light absorption by the upper cladding layer 132, the semiconductor laser 200 has difficulty in sufficiently improving its characteristics. In addition, the configuration of the semiconductor stack 220 does not sufficiently confine light in the stacked in-plane direction, which can result in unstable operation of the semiconductor laser 200.

FIG. 5 schematically illustrates a cross-sectional configuration of a semiconductor laser 300 according to Comparative Example C. The semiconductor laser 300 is provided with an upper guiding layer 321 having a larger thickness instead of the upper guiding layer 121 having a smaller thickness. Such a configuration allows for reduction of the intensity of light leaked into the upper cladding layer 132 in a transverse optical mode formed in the resonator (see a light waveguide region 320B of FIG. 5). However, since the upper cladding layer 132 is located far away from the active layer 23, light is insufficiently confined in the stacked in-plane direction, which can result in unstable laser operation.

In contrast, in the present embodiment, the upper cladding layer 31 includes a transparent conductive material. Further, the low-concentration impurity layer 24 provided between the active layer 23 and the contact layer 25 has an impurity concentration of $5.0 \times 10^{17}$ $cm^{-3}$ or less, and has a total thickness of 250 nm or more and 1000 nm or less. Moreover, the distance between the low-concentration impurity layer 24 and the upper cladding layer 31 is 150 nm or less. This allows for reduction of the light absorption by the transparent conductive material, and further, even without, e.g., a thick cladding layer including AlGaN doped with Mg, light is confined in the stacking direction by the upper cladding layer 31 including the transparent conductive material. In the present embodiment, the ridge section 20A having a strip shape is further formed. Therefore, the light is also confined in the transverse direction. This makes it possible to reduce the drive voltage.

In addition, in the present embodiment, the upper cladding layer 31 includes a transparent conductive material. Further, the low-concentration impurity layer 24 provided between the active layer 23 and the contact layer 25 has an impurity concentration of $5.0 \times 10^{17}$ $cm^{-3}$ or less. Further, the upper cladding layer 31 is located away from the light waveguide region 20B that is to be generated inside the semiconductor stack 20 in a case where the semiconductor laser 1 is driven. That is, the ratio of the light intensity at the boundary of the upper cladding layer 31 closer to the active layer 23 to the maximum light intensity is less than 0.007.

This allows for reduction of the light absorption by the transparent conductive material, and further, even without, e.g., a thick cladding layer including AlGaN doped with Mg, light is confined in the stacking direction by the upper cladding layer 31 including the transparent conductive material. In the present embodiment, the ridge section 20A having a strip shape is further formed. Therefore, the light is also confined in the transverse direction. This makes it possible to reduce the drive voltage.

FIG. 6 illustrates one example of I-V characteristics of the semiconductor laser 100 according to Comparative Example A, of the semiconductor laser 200 according to Comparative Example B, and of the semiconductor laser 1 according to Example. The results in FIG. 6 were obtained by a semiconductor simulator. In the semiconductor simulator, in Example, the impurity concentration of the low-concentration impurity layer 24 was set to $2.0 \times 10^{16}$ $cm^{-3}$, and the thickness of the low-concentration impurity layer 24 was set to 500 nm. In the semiconductor simulator, in Comparative Examples A and B, the impurity concentration of the upper guiding layer 121 was set to $2.0\times10^{16}$ cm$^{-3}$, and the thickness of the upper guiding layer 121 was set to 200 nm. FIG. 6 indicates that the drive voltage in Example is lower than those in Comparative Examples A and B.

FIG. 7 illustrates one example of I-L characteristics of the semiconductor laser 100 according to Comparative Example A, of the semiconductor laser 200 according to Comparative Example B, and of the semiconductor laser 1 according to Example. FIG. 7 indicates that Example provides a greater light output than Comparative Examples A and B.

FIG. 8 illustrates one example of L-WPE (electric power conversion efficiency) characteristics of the semiconductor laser 100 according to Comparative Example A, of the semiconductor laser 200 according to Comparative Example B, and of the semiconductor laser 1 according to Example. FIG. 8 indicates that the electric power conversion efficiency in Example is higher than those in Comparative Examples A and B.

Moreover, in the present embodiment, the semiconductor stack 20 (the lower cladding layer 21, the active layer 23, the low-concentration impurity layer 24, and the contact layer 25) includes a nitride semiconductor, and the upper cladding layer 31 formed over the semiconductor stack 20 includes ITO or ITiO. This allows the upper cladding layer 31 to confine light in the stacking direction even without, e.g., a thick cladding layer including AlGaN doped with Mg. This makes it possible to reduce the drive voltage compared to a case where a thick cladding layer including AlGaN doped with Mg is provided.

2. MODIFICATION EXAMPLES

Description is given next of modification examples of the semiconductor laser 1 according to the present embodiment. FIGS. 9 to 14 illustrate modification examples of a cross-sectional configuration of the semiconductor laser 1.

Modification Example A

In the present embodiment, the contact layer 25 may have a large thickness as illustrated in, e.g., FIG. 9. In this case, the ridge section 20A may be formed by etching a portion of the contact layer 25, for example. In addition, in the contact layer 25, the portion located directly under the ridge section 20A may have a larger thickness than the base portion of the ridge section 20A. Even such a configuration allows for reduction of the light absorption by the transparent conductive material, and further, even without, e.g., a thick cladding layer including AlGaN doped with Mg, light is confined in the stacking direction by the upper cladding layer 31 including the transparent conductive material. Further, the light is confined by the ridge section 20A also in the transverse direction. This makes it possible to reduce the drive voltage.

Modification Example B

In the above embodiment and the modification examples thereof, as illustrated in, e.g., FIG. 10, in the semiconductor laser 1, a carrier blocking layer 26 that is a layer different from the low-concentration impurity layer 24 may be provided to the low-concentration impurity layer 24. In this case, the carrier blocking layer 26 is provided between the active layer 23 and the contact layer 25. In this case, in the low-concentration impurity layer 24, the portion located directly under the ridge section 20A may have a larger thickness than the base portion of the ridge section 20A. The carrier blocking layer 26 enables substantial prevention of a carrier injected from side closer to the substrate 10 from entering the ridge section 20A across the active layer 23. Providing the carrier blocking layer 26 allows for improvement of carrier utilization efficiency, thus making it possible to improve the electric power conversion efficiency of the semiconductor laser 1.

The carrier blocking layer 26 includes, for example, a p-type semiconductor layer. The carrier blocking layer 26 includes, for example, one of a GaN layer, an AlGaN layer, an InGaN layer, and an AlGaInN layer, or at least two layers of these layers. In the carrier blocking layer 26, for example, Mg is used as a dopant to obtain p-type conductivity. The carrier blocking layer 26 has a thickness of, e.g., 3 nm to 50 nm.

In the present modification example, the carrier blocking layer 26 that is a layer different from the low-concentration impurity layer 24 is provided to the low-concentration impurity layer 24. Even such a configuration allows for reduction of the light absorption by the transparent conductive material, and further, even without, e.g., a thick cladding layer including AlGaN doped with Mg, light is confined in the stacking direction by the upper cladding layer 31 including the transparent conductive material. Further, the light is confined by the ridge section 20A also in the transverse direction. This makes it possible to reduce the drive voltage.

Modification Example C

In the above Modification Example B, as illustrated in, e.g., FIG. 11, the ridge section 20A may be formed by etching a portion of the contact layer 25, a portion of the carrier blocking layer 26, and a portion of the low-concentration impurity layer 24. In this case, in the low-concentration impurity layer 24 located between the carrier blocking layer 26 and the active layer 23, the portion located directly under the ridge section 20A may have a larger thickness than the base portion of the ridge section 20A. Such a configuration allows the ridge section 20A to confine light more strongly in the transverse direction, thus obtaining better light output characteristics. In addition, light absorption by the transparent conductive material is reduced, and further, even without, e.g., a thick cladding layer including AlGaN doped with Mg, light is confined in the stacking direction by the upper cladding layer 31 including the transparent conductive material. This makes it possible to reduce the drive voltage.

Modification Example D

In the above Modification Example C, the composition of the carrier blocking layer 25 may be graded such that band gap energy of the carrier blocking layer 26 decreases toward the contact layer 25. In this case, as illustrated in, e.g., FIG. 12, the carrier blocking layer 26 has a graded layer 26A in which the composition of the carrier blocking layer 25 is graded such that the band gap energy decreases toward the contact layer 25. For example, in a case where AlGaN with 10% of Al is used as the carrier blocking layer 26 and the contact layer 25 including GaN is stacked thereon, the composition gradient (the graded layer 26A) of the carrier blocking layer 26 enables control of electron overflow. In addition, the composition gradient (the graded layer 26A) of the carrier blocking layer 25 also enables reduction of the concentration of holes accumulated on the interface between the carrier blocking layer 26 and the contact layer 25. For example, the simulation result illustrated in FIG. 13 indicates that provision of the graded layer 26A allows for reduction of the hole concentration on the interface between the carrier blocking layer 26 and the contact layer 25. Moreover, it also indicates that an increase in the thickness of the graded layer 26A allows for greater reduction of the hole concentration on the interface between the carrier blocking layer 26 and the contact layer 25.

In the above Modification Example C, the ridge section 20A may be formed by etching the carrier blocking layer 26. At that time, the holes accumulated on the interface between the carrier blocking layer 26 and the contact layer 25 disappear due to non-radiative recombination occurring on the surface of the ridge section 20A. The holes accumulated on the interface between the carrier blocking layer 26 and the contact layer 25 are allowed to easily move in the ridge section 20A as two-dimensional electron gas. Therefore, the higher the concentration of the holes accumulated on the interface between the carrier blocking layer 26 and the contact layer 25 is, the higher the number of holes that are to disappear during non-radiative recombination is, thus resulting in degradation of light emission efficiency.

However, in this modification example, the composition of the carrier blocking layer 26 may be graded such that the band gap energy of the carrier blocking layer 26 decreases toward the contact layer 25. This reduces the concentration of the hole accumulated on the interface between the carrier blocking layer 26 and the contact layer 25. As can be seen, in this modification example, grading the composition of the carrier blocking layer 26 makes it possible not only to control electron overflow but also to reduce non-radiative recombination occurring on the surface of the ridge section 20A. This makes it possible to significantly improve light emission efficiency.

Modification Example E

In the above Modification Example B, as illustrated in, e.g., FIG. 14, the carrier blocking layer 26 may be provided between the active layer 23 and the low-concentration impurity layer 24. Even such a configuration allows for reduction of the light absorption by the transparent conductive material, and further, even without, e.g., a thick cladding layer including AlGaN doped with Mg, light is confined in the stacking direction by the upper cladding layer 31 including the transparent conductive material. Further, the light is confined by the ridge section 20A also in the transverse direction. This makes it possible to reduce the drive voltage.

Modification Example F

In the above Modification Example A, as illustrated in, e.g., FIG. 15, the carrier blocking layer 26 may be provided between the low-concentration impurity layer 24 and the contact layer 25. In this case, the contact layer 25 may have a large thickness, the ridge section 20A may be formed by etching a portion of the contact layer 25, and the carrier blocking layer 26 may be formed in contact with the contact layer 25. Even such a configuration allows for reduction of the light absorption by the transparent conductive material, and further, even without, e.g., a thick cladding layer including AlGaN doped with Mg, light is confined in the stacking direction by the upper cladding layer 31 including the transparent conductive material. Further, the light is confined by the ridge section 20A also in the transverse direction. This makes it possible to reduce the drive voltage.

Modification Example G

In the above embodiment and Modification Examples A to F, as illustrated in, e.g., FIG. 16, the semiconductor laser 1 may include an upper cladding layer 27 between the contact layer 25 and the low-concentration impurity layer 24. The upper cladding layer 27 is, e.g., an AlGaN layer doped with Mg, and has a smaller thickness than the low-concentration impurity layer 24 at a portion that faces the ridge section 20A. The total thickness of the contact layer 25 and the upper cladding layer 31 is, for example, 150 nm or less. Even such a configuration allows for reduction of the light absorption by the transparent conductive material, and further, even without, e.g., a thick cladding layer including AlGaN doped with Mg, light is confined in the stacking direction by the upper cladding layer 31 including the transparent conductive material. Further, the light is confined by the ridge section 20A also in the transverse direction. This makes it possible to reduce the drive voltage.

Modification Example H

In the above embodiment and Modification Examples A to G, the semiconductor stack 20 may include a Group III-V nitride semiconductor including one of As, B, Sb, and P, or at least two layers of these layers. Even in such a case, light is confined in the stacking direction by the upper cladding layer 31 and is confined in the transverse direction by the ridge section 20A. This makes it possible to reduce the drive voltage.

Modification Example I

In the above embodiment and Modification Examples A to H, a metal layer or resin layer may be provided instead of the insulating layer 32. Alternatively, in the above embodiment and Modification Examples A to G, the insulating layer 32 may be omitted, and in addition, within the semiconductor stack 20, a portion around the ridge section 20A and the base portion of the ridge section 20A (that is, a portion in contact with the insulating layer 32) may be exposed to the atmosphere. Even in such a case, light is confined in the stacking direction by the upper cladding layer 31 and is confined in the transverse direction by the ridge section 20A. This makes it possible to reduce the drive voltage.

3. SECOND EMBODIMENT

Description is given next of a projector 2 according to a second embodiment of the present disclosure. FIG. 17 illustrates one example of a schematic configuration of the projector 2. The projector 2 is a device that projects an image on the basis of an externally inputted image signal Din on, e.g., a screen. The projector 2 includes a video signal processing circuit 41, a laser driving circuit 42, a light source unit 43, a scanner unit 44, and a scanner driving circuit 45.

The video signal processing circuit 41 generates a projection image signal for each color on the basis of the image signal Din. The laser driving circuit 42, on the basis of the projection image signal for each color, controls the crest value of a current pulse to be applied to light sources 43R, 43G, and 43B, which will be described later.

The light source unit 43 includes a plurality of light sources, for example, three light sources 43R, 43G, and 43B. The three light sources 43R, 43G, and 43B are used as laser light sources that output respective beams of laser light with red (R), green (G), and blue (B) wavelengths, for example.

At least one of the light source 43B or 43G includes the semiconductor laser 1 according to the above embodiment and the modification examples thereof. The respective beams of laser light outputted from the three light sources 43R, 43G, and 43B are made into substantially parallel light beams by a collimate lens, for example. Thereafter, the resultant light is converged into a single beam of laser light by, e.g., beam splitters 43sR, 43sG, and 43sB. The beam splitter 43sR reflects red light, for example. The beam splitter 43sG reflects green light, for example, and allows the red light to transmit therethrough. The beam splitter 43sB reflects blue light, for example, and allows the red light and the green light to transmit therethrough.

The laser light that has transmitted through, and has been reflected by, the beam splitters 43sR, 43sG, and 43sB enters the scanner unit 44. The scanner unit 44 includes one two-axis scanner, for example. The irradiation angle of the entered laser light is modulated by the two-axis scanner in horizontal and vertical directions, and thereafter, the resultant laser light is projected on a screen. It is to be noted that the scanner unit 44 may have a configuration in which two single-axis scanners are used to perform scanning in the horizontal direction and the vertical direction.

The scanner unit 44 commonly includes a sensor that detects an irradiation angle of, e.g., the two-axis scanner. The sensor outputs an angle signal for each of the horizontal and vertical directions. These angle signals are inputted to the scanner driving circuit 45. The scanner driving circuit 45 drives the scanner unit 44 to obtain a desired irradiation angle on the basis of a horizontal angle signal and a vertical angle signal that are inputted from the scanner unit 44, for example.

In the present embodiment, the light source 43B includes the semiconductor laser 1 according to the above embodiment and the modification examples thereof. This makes it possible to obtain high emission intensity with lower power consumption.

4. THIRD EMBODIMENT

Description is given next of a display device 3 according to a third embodiment of the present disclosure. FIG. 18 illustrates one example of a schematic configuration of the display device 3. The display device 3 includes, e.g., a pixel array unit 40, a controller 50, and a driver 60. A pixel array unit 40 includes a plurality of display pixels 40A arranged in a matrix. The controller 50 and the driver 60 drive each of the display pixels 40A on the basis of the externally inputted image signal Din and an externally inputted synchronization signal Tin.

The controller 50 and the driver 60 drive each display pixel 40A by active-matrix-driving to allow the pixel array unit 40 to display an image based on the externally inputted image signal Din and the externally inputted synchronization signal Tin. The pixel array unit 40 includes a plurality of scan lines extending in a row direction, a plurality of signal lines extending in a column direction, and a plurality of display pixels 40A that are respectively provided one by one at intersections of the scan lines and the signal lines.

The scan lines are used for selection of each display pixel 40A, and supply each display pixel 40A with a selection pulse that selects each display pixel 40A on a predetermined unit basis (for example, a pixel row basis). The signal lines are used to supply each display pixel 40A with a signal voltage corresponding to the image signal Din, and supply each display pixel 40A with a data pulse including the signal voltage.

Each of the display pixels 40A includes a plurality of sub-pixels each including a semiconductor laser. In each of the display pixels 40A, out of the plurality of sub-pixels, at least one of the semiconductor laser that emits blue light or the semiconductor laser that emits green light is the semiconductor laser 1 according to the above embodiment and the modification examples thereof.

The driver 60 includes, for example, a horizontal selector 61 and a write scanner 62. The horizontal selector 61 applies, to each of the signal lines, for example, an analog signal voltage inputted from an image signal processing circuit 51 in accordance with (in synchronization with) input of a control signal from the controller 50. The write scanner 62 scans the plurality of display pixels 40A on a predetermined unit basis. Specifically, the write scanner 62 sequentially outputs a selection pulse to each of the scanning lines in one frame period. The write scanner 62 selects, for example, the plurality of scanning lines in a predetermined sequence in accordance with (in synchronization with) input of a control signal from the controller 50 to execute writing of the signal voltage in a desired order.

The controller 50 includes, for example, the image signal processing circuit 51, a timing generation circuit 52, and a power supply circuit 53. The image signal processing circuit 51 performs, for example, predetermined correction on the digital image signal Din that has been externally inputted, and generates a signal voltage on the basis of a thus-obtained image signal. The image signal processing circuit 51 outputs, for example, the generated signal voltage to the horizontal selector 61. The timing generation circuit 52 performs control to cause each circuit in the driver 60 to operate in conjunction with one another. The timing generation circuit 52 outputs, for example, a control signal to each of the circuits in the driver 60 in accordance with (in synchronization with) the externally inputted synchronization signal Tin. The power supply circuit 53 generates, and supplies, various fixed voltages necessary for various circuits such as the horizontal selector 61, the write scanner 62, the image signal processing circuit 51, the timing generation circuit 52, and the power supply circuit 53.

In the present embodiment, each of the display pixels 40A includes the semiconductor laser 1 according to the above embodiment and the modification examples thereof. This makes it possible to obtain high emission intensity with lower power consumption.

5. FOURTH EMBODIMENT

Description is given next of an electronic apparatus 4 according to a fourth embodiment of the present disclosure. FIG. 19 illustrates one example of a perspective configuration of the electronic apparatus 4. The electronic apparatus 4 is, for example, a mobile terminal having a display surface on a main surface of a plate-shaped housing. The electronic apparatus 4 includes, for example, the display device 3 according to the third embodiment at a position of the display surface. The pixel array unit 40 of the display device 3 is disposed on the display surface of the electronic apparatus 4.

In the present embodiment, each of the display pixels 40A includes the semiconductor laser 1 according to the embodiment and the modification examples thereof. This makes it possible to obtain high emission intensity with lower power consumption.

It is to be noted that the display device 3 according to the above third embodiment is applicable to a display device of any of electronic apparatuses in every field that display externally inputted image signals or internally generated image signals as images or pictures. Examples of the electronic apparatuses include a television, a digital camera, a notebook personal computer, a mobile terminal apparatus such as a mobile phone, and a video camera.

As can be seen, the present disclosure is described with reference to the multiple embodiments. However, the present disclosure is not limited to the respective embodiments, etc., and various modifications are possible. It is to be noted that the effects described in the specification are mere examples. The effects of the present disclosure are not limited to the effects described in this specification. The present disclosure may have another effect other than the effects described in the specification.

Moreover, for example, the present disclosure may have the following configuration.

(1)

A semiconductor laser including a semiconductor stack including, in the following order, a first cladding layer, an active layer, one or a plurality of low-concentration impurity layers, a contact layer, and a second cladding layer that includes a transparent conductive material, the semiconductor stack having, in a portion including the contact layer, a ridge extending in a stacked in-plane direction, the one or the plurality of low-concentration impurity layers having an impurity concentration of $5.0 \times 10^{17}$ cm$^{-3}$ or less, a total thickness of the low-concentration impurity layer being 250 nm or more and 1000 nm or less, a distance between the second cladding layer and the low-concentration impurity layer closest to the second cladding layer being 150 nm or less.

(2)

The semiconductor laser according to (1), in which the first cladding layer, the active layer, the low-concentration impurity layer, and the contact layer each include a nitride-based semiconductor material.

(3)

The semiconductor laser according to (1) or (2), in which the transparent conductive material is ITO or ITiO.

(4)

The semiconductor laser according to any one of (1) to (3), in which the impurity included in the low-concentration impurity layer is at least one of magnesium, copper, silicon, or oxygen.

(5)

The semiconductor laser according to any one of (1) to (4), further including a carrier blocking layer provided between the active layer and the contact layer, in which, in the low-concentration impurity layer, a portion located directly under the ridge has a larger thickness than a base portion of the ridge.

(6)

The semiconductor laser according to (5), in which the carrier blocking layer has a graded layer in which a composition is graded to allow band gap energy of the carrier blocking layer to decrease toward the contact layer.

(7)

A semiconductor laser including a semiconductor stack including, in the following order, a first cladding layer, an active layer, one or a plurality of low-concentration impurity layers that has an impurity concentration of $5.0 \times 10^{17}$ cm$^{-3}$ or less, a contact layer, and a second cladding layer that includes a transparent conductive material, the semiconductor stack having, in a portion including the contact layer, a ridge extending in a stacked in-plane direction, the second cladding layer being located away from a light waveguide region that is to be generated inside the semiconductor stack in a case where the semiconductor laser is driven, a ratio of a light intensity at a boundary of the second cladding layer closer to the active layer to a maximum light intensity being less than 0.007.

(8)

An electronic apparatus including a semiconductor laser serving as a light source, the semiconductor laser including a semiconductor stack including, in the following order, a first cladding layer, an active layer, one or a plurality of low-concentration impurity layers, a contact layer, and a second cladding layer that includes a transparent conductive material, the semiconductor stack having, in a portion including the contact layer, a ridge extending in a stacked in-plane direction, the one or the plurality of low-concentration impurity layers having an impurity concentration of $5.0 \times 10^{17}$ cm$^{-3}$ or less, a total thickness of the low-concentration impurity layer being 250 nm or more and 1000 nm or less, a distance between the second cladding layer and the low-concentration impurity layer closest to the second cladding layer being 150 nm or less.

(9)

An electronic apparatus including a semiconductor laser serving as a light source, the semiconductor laser including a semiconductor stack including, in the following order, a first cladding layer, an active layer, one or a plurality of low-concentration impurity layers that has an impurity concentration of $5.0 \times 10^{17}$ cm$^{-3}$ or less, a contact layer, and a second cladding layer that includes a transparent conductive material, the semiconductor stack having, in a portion including the contact layer, a ridge extending in a stacked in-plane direction, the second cladding layer being located away from a light waveguide region that is to be generated inside the semiconductor stack in a case where the semiconductor laser is driven, a ratio of a light intensity at a boundary of the second cladding layer closer to the active layer to a maximum light intensity being less than 0.007.

The first semiconductor laser, the second semiconductor laser, the first electronic apparatus, and the second electronic apparatus according to the above embodiments allow for reduction of the light absorption by the transparent conductive material, and further, even without, e.g., a thick cladding layer including AlGaN doped with Mg, light is confined in the layer stacking direction by the second cladding layer including the transparent conductive material and is further confined in the transverse direction by the stripe-shaped ridge. This makes it possible to reduce the drive voltage. It is to be noted that effects of the present disclosure are not necessarily limited to the effects described above, and may include any of effects that are described in this specification.

This application claims the benefit of Japanese Priority Patent Application JP2018-008955 filed with the Japan Patent Office on Jan. 23, 2018, the entire contents of which are incorporated herein by reference.

It should be understood by those skilled in the art that various modification, combinations, sub-combinations and alterations may occur depending on design requirements and other factors insofar as they are within the scope of the appended claims or the equivalents thereof.

The invention claimed is:

1. A semiconductor laser comprising
a semiconductor stack including, in a following order, a first cladding layer, an active layer, one or a plurality of low-concentration impurity layers, a contact layer, and a second cladding layer that includes a transparent conductive material, the semiconductor stack having, in a first portion including the contact layer, a ridge extending in a stacked in-plane direction,
the one or the plurality of low-concentration impurity layers having an impurity concentration of $5.0 \times 10^{17}$ cm$^{-3}$ or less, a total thickness of the low-concentration impurity layer being 250 nm or more and 1000 nm or less,
a distance between the second cladding layer and the low-concentration impurity layer closest to the second cladding layer being 150 nm or less.

2. The semiconductor laser according to claim 1, wherein the first cladding layer, the active layer, the low-concentration impurity layer, and the contact layer each include a nitride semiconductor.

3. The semiconductor laser according to claim 2, wherein the transparent conductive material is ITO (Indium Tin Oxide) or ITiO (Indium Titanium Oxide).

4. The semiconductor laser according to claim 1, wherein an impurity included in the low-concentration impurity layer is at least one of magnesium, copper, silicon, or oxygen.

5. The semiconductor laser according to claim 1, further comprising a carrier blocking layer provided between the active layer and the contact layer, wherein, in the low-concentration impurity layer, a second portion located directly under the ridge has a larger thickness than a base portion of the ridge.

6. The semiconductor laser according to claim 5, wherein the carrier blocking layer has a graded layer in which a composition is graded to allow band gap energy of the carrier blocking layer to decrease toward the contact layer.

7. A semiconductor laser comprising
a semiconductor stack including, in a following order, a first cladding layer, an active layer, one or a plurality of low-concentration impurity layers that has an impurity concentration of $5.0 \times 10^{17}$ cm$^{-3}$ or less, a contact layer, and a second cladding layer that includes a transparent conductive material, the semiconductor stack having, in a portion including the contact layer, a ridge extending in a stacked in-plane direction,
the second cladding layer being located away from a light waveguide region that is to be generated inside the semiconductor stack in a case where the semiconductor laser is driven,
a ratio of a light intensity at a boundary of the second cladding layer closer to the active layer to a maximum light intensity being less than 0.007.

8. An electronic apparatus comprising
a semiconductor laser serving as a light source,
the semiconductor laser including a semiconductor stack including, in a following order, a first cladding layer, an active layer, one or a plurality of low-concentration impurity layers, a contact layer, and a second cladding layer that includes a transparent conductive material, the semiconductor stack having, in a portion including the contact layer, a ridge extending in a stacked in-plane direction,
the one or the plurality of low-concentration impurity layers having an impurity concentration of $5.0 \times 10^{17}$ cm$^{-3}$ or less, a total thickness of the low-concentration impurity layer being 250 nm or more and 1000 nm or less,
a distance between the first cladding layer and the low-concentration impurity layer closest to the first cladding layer being 150 nm or less.

9. An electronic apparatus comprising
a semiconductor laser serving as a light source,
the semiconductor laser including a semiconductor stack including, in a following order, a first cladding layer, an active layer, one or a plurality of low-concentration impurity layers that has an impurity concentration of $5.0 \times 10^{17}$ cm$^{-3}$ or less, a contact layer, and a second cladding layer that includes a transparent conductive material, the semiconductor stack having, in a portion including the contact layer, a ridge extending in a stacked in-plane direction,
the second cladding layer being located away from a light waveguide region that is to be generated inside the semiconductor stack in a case where the semiconductor laser is driven,
a ratio of a light intensity at a boundary of the second cladding layer closer to the active layer to a maximum light intensity being less than 0.007.

* * * * *